United States Patent
Kister et al.

(10) Patent No.: US 6,420,887 B1
(45) Date of Patent: Jul. 16, 2002

(54) MODULATED SPACE TRANSFORMER FOR HIGH DENSITY BUCKLING BEAM PROBE AND METHOD FOR MAKING THE SAME

(75) Inventors: January Kister, Redwood City, CA (US); Jean-Michel Jurin, Nainville; Isabelle George, Paris, both of (FR)

(73) Assignee: Kulicke & Soffa Investment, Inc., Wilmington, DE (US)

(*) Notice: Subject to any disclaimer, the term of this patent is extended or adjusted under 35 U.S.C. 154(b) by 0 days.

(21) Appl. No.: 09/593,314

(22) Filed: Jun. 13, 2000

(51) Int. Cl.[7] ............................................. G01R 31/02
(52) U.S. Cl. ........................ 324/754; 324/757; 324/761; 324/755
(58) Field of Search .............................. 324/754, 755, 324/757, 761, 762, 765, 759; 361/769, 790, 767, 768; 439/74, 530

(56) References Cited

U.S. PATENT DOCUMENTS

| | | | | |
|---|---|---|---|---|
| 5,534,784 A | * | 7/1996 | Lum | |
| 5,635,846 A | * | 6/1997 | Beaman | |
| 5,818,248 A | * | 10/1998 | St. Onge | |
| 6,229,320 B1 | * | 5/2001 | Haseyama | |
| 6,265,886 B1 | * | 7/2001 | Hamren | |

* cited by examiner

Primary Examiner—Michael J. Sherry
Assistant Examiner—Trung Q. Nguyen
(74) Attorney, Agent, or Firm—Lumen Intellectual Property Services, Inc.

(57) ABSTRACT

A space transformer made up of a primary structure that is fabricated from semiconductor body for retaining beam probes used for contacting the pads of a circuit or device under test. The primary structure is part of the space transformer and has vias that hold the beam probes, and a ceramic support structure to provide sufficient stiffness before bonding it to a secondary structure of the space transformer. The fabrication of the primary structure and its embedding within the secondary structure is performed in a manner analogous to the fabrication of circuit chips and its embedding within the packaging. As a result, down scaling in chip fabrication can be correspondingly applied to the fabrication of space transformers.

8 Claims, 3 Drawing Sheets

MODULATED SPACE TRANSFORMER FOR HIGH DENSITY BUCKLING BEAM PROBE AND METHOD FOR MAKING THE SAME

FIELD OF INVENTION

The present invention relates to the field of buckling beam probe apparatus. More specifically, the present invention relates to space transformers for buckling beam probe apparatus.

BACKGROUND OF INVENTION

Chips are becoming more and more compact and perform an increasing number of logical operations at higher and higher clocking frequencies. For testing purposes, chips typically provide a two dimensional array of contacting pads, which can be accessed, e.g. by buckling beam probe apparatus as it is well-known to those skilled in the art. High performance chips have a larger number of contacting pads with smaller size and smaller pitch. Due to the high contact densities on the chip top surface pad arrays are being more and more frequently replaced by ball grid arrays.

Buckling beam probe apparatus are typically utilized to test high performance chips. Their design concept is mainly based on a number of buckling beam probes that are held in a parallel fashion such that they can provide uniform access to contact pad arrays and/or ball grid arrays. To provide uniform contacting characteristics, e.g. equal contact force, scrub length etc., it is crucial that the buckling beams have identical configurations and are embedded and accessed within the probe apparatus under uniform conditions. Hence, the access side of the buckling beam matrix has an essentially identical geometric configuration to the contacting side. At the access side a space transformer provides electrical contact with each individual buckling beam. Consequently, the space transformer has to provide the same density of contacts for the buckling beams as it is dictated by the pads on the chip to be tested.

Unfortunately, the contact between the buckling beams and the space transformer is under higher cyclic strain than the contacts of the chip. The contact pads or contacting balls on the chip are only exposed to the loads and abrasion during the testing sequence once. Then the die chips are cut and packaged. The contact pads of the space transformer are exposed to repeated loading during each test cycle and subjected to increased wear.

Due to increased voltages and currents applied to the chip during the test, the contacts of the space transformer additionally have to endure higher electrical strains than the chip contacts during their regular use.

The discrepancies between the mechanical and electrical strain of space transformer contacts and chip contacts become more pronounced, the more the geometrical configuration of the contact pads or contact balls of the chips are pushed to the limits defined by the regular use of the chip.

The functional testing of the chips on the wafer level becomes an increasingly critical step in the fabrication process of high performance chips. The complexity of the logical operations that need to be tested make the testing sequence more time consuming. In addition, the chips have to be tested under elevated temperatures, which introduces a time consuming step in the chip fabrication. Therefore, it becomes desirable to test more and more chips simultaneously on the wafer level.

The space transformer not only provides contact with the buckling beams but also has to provide a conductive path between the tightly arrayed buckling beams and peripheral contact pads where relatively bulky cables are attached. For high speed testing at high clocking frequencies, where the parasitic inductive and capacitate limitations of the conductive path become relevant, the space transformer also provides intermediate logical circuitry. This intermediate logical circuitry works to up/down convert testing signal frequencies from low transmission frequencies to high testing frequencies. The low transmission frequencies are typically at levels where the inductance and capacitance in the transmission path is irrelevant.

The frequency converting circuitry is ideally placed within the space transformer in close proximity to the buckling beams to reduce the inductive path to the chip as much as possible. Frequency down converting of electric signals may be accomplished by dividing them and assigning them to a higher number of conductive paths. In summary, the space transformer provides a spatial expansion of a constant and/or increasing number of conductive paths in direction from the tightly arrayed buckling beams to the large peripheral contacts.

A number of space transformer systems have been developed to keep up with the ever increasing demands as described above. Specifically, more intermediate structures fabricated with independent technologies are being combined to bridge the scale differences between the central buckling beam contact density and the peripheral contact density.

U.S. Pat. No. 5,132,613, for instance, describes a low inductance side mount decoupling test structure that utilizes a stacked substrate MLC space transformer. The space transformer consists of an interface substrate, a "personal" substrate and an interposer block. It is fabricated from a number of individual layers that are laminated and sintered together.

Even though the described test structure provides a good scaling ratio between the central probes and the peripheral contacts, the fabrication process is time consuming and complicated. The invention does not take into consideration specific needs for contacting the probes.

U.S. Pat. No. 5,806,181 describes "contact carriers for populating larger substrates with spring contacts". The scaling of the central probe contacts and the peripheral contacts is provided by a number of stages that are connected to each other by wire bonding. The wire bonding introduces additional inductance and affects the performance of the probe apparatus at high frequencies. The probes themselves are also wire bonded to the space transformer.

U.S. Pat. No. 5,821,763 describes a test probe for high density integrated circuits, methods of fabrication and use thereof. A ceramic packaging substrate used to package integrated circuit chips is utilized as a space transformer. The invention provides the space transformer by utilizing a structure developed for packaging of integrated circuit chips. The probes are wire bonded to the space transformer, which is optionally connected to a second fan-out structure by an interposer. The invention is also subject to the limitations described for the above patents.

It has become common practice to utilize packaging structures of circuit chips as space transformers. Since the packaging provides a similar fanning-out of the conductive paths between the circuit chip and the printed circuit board, it is preferably utilized as a space transformer. Never the less, specifics of the packaging impose limitations in its feasibility for space transformer.

First, for testing a circuit chip different signal and voltage schemes have to be applied. This increases the number of required conductive paths. Since package systems for chips are typically mass-produced, these slight differences can be compensated only with a more than proportional effort and expense.

Second, package systems are primarily designed for a permanent connection to circuit chips rather than for a high number of contacting actions. As a result, the preferred method of contacting beam probes to space transformers adapted from packaging structures is wire bonding. Wire bonding becomes increasingly disadvantageous for conductively connecting beam probes to the space transformer at high frequencies as it is described in the above.

Third, package systems are typically designed for a single circuit chip. In a test probe apparatus that tests a number of circuit chips simultaneously space transformers based on packaging structures have limited use since different fan-out concepts for the conductive paths have to be utilized.

U.S. Pat. No. 4,038,599 discloses a high density wafer contacting and test system that utilizes a space transformer essentially made from silicon like a circuit chip. The space transformer has traces and logical circuitry to compose test signals from two orthogonal oriented trace arrays that traverse the space transformer. In that way, a low number of traces is utilized to provide a high number of probe beams with testing signals. The space transformer is a monolithic unit that provides the peripheral contact pads for the supply cables. The space transformer further provides contact pads against which ball-like heads of the probe beams are pressed.

The use of chip fabrication techniques to provide the space transformer is rooted in the need to include logical circuitry that is necessary to provide the large number of testing signals from a small number of conductive traces. The contact pads that are provided to the space transformer are subject to increased wear from repeated mechanical impact of the ball heads against the pads and potential oxidation in the contacting gap.

OBJECTS AND ADVANTEGES

It is a primary object of the present invention to provide a space transformer that includes a primary structure that provides the contact to a high density beam probe matrix and provides an up scaled conductive connection between the beam probe matrix and a secondary space transformer structure.

It is another object of the present invention to provide the primary structure in a configuration that can be fabricated with techniques commonly utilized for the fabrication of circuit chips.

It is also an object of the present invention, to provide the primary structure with contacting features that allow to contact the individual probes of a high density beam probe matrix in a way that exceeds the geometric conditions defined by contact pad arrays and/or ball grid arrays of high performance circuit chips.

Finally, it is an object of the present invention to provide a method for mechanically and conductively combining the primary structure with other structures of the space transformer.

SUMMARY

The present invention introduces a primary space transformer structure manufactured from silicon or other material used for the fabrication of circuit chips. In the preferred embodiment, the primary structure has vias such that the beam probes can be held by friction in the space transformer without having to impose an external contacting force on the primary structure. The primary structure has layers of metallized traces that allow to redistribute and fan out the conductive paths towards a intermediate connector system. The intermediate connector system provides the conductive connection between the primary structure and the beam probes. An adjacent secondary structure is provided and designed for contact with the intermediate connector system. The adjacent secondary structure serves to further scale up the spatial dimension between the individual contacts.

In the preferred embodiment, the intermediate connector system is a ball grid array, which may be located on the opposite side or the same side of the primary structure as the beam probes. The contact balls of the ball grid array contact pads of the secondary structure that fans out the conductive paths such that a printed circuit board may be contacted at a scale feasible for the printed circuit board.

The primary structure consists of a substrate that preferably contains the conductive traces and a ceramic structure that leads the primary structure the necessary stiffness. The substrate is bonded to the ceramic structure. In the case, where the ball grid array is on the opposite side of the beam probes, the ceramic structure has recesses where the contact balls are positioned.

In the preferred embodiment, the primary structure is pressed with the ball grid array against the contact pads of the secondary structure by suitable elements like, for instance, screws. In a following step the hollow space between primary and secondary structure is filled with a resin, which is cured in a final step.

In an alternate embodiment, the primary structure is conductively connected to the secondary structure via wire bonding performed on the periphery of the beam probe side of the primary structure. Adjustment screws allow to tune the position, orientation and/or eventually the planarity of the primary structure before it is fixated and bonded together with the secondary structure as it is described in the paragraph above.

The introduction of the primary structure allows, on the one hand, for more flexibility in the design of test probe apparatus because of the relatively easy fabrication of chip like structures. On the other hand, the selection of a primary structure that corresponds in its fabrication to that of circuit chips ensures the ability to keep pace with further down scaling in chip fabrication.

DETAILED DESCRIPTION

Although the following detailed description contains many specifics for the purposes of illustration, anyone of ordinary skill in the art will appreciate that many variations and alterations to the following details are within the scope of the invention. Accordingly, the following preferred embodiment of the invention is set forth without any loss of generality to, and without imposing limitations upon, the claimed invention.

A primary structure 1A, 1B (see FIGS. 1, 2) is included in a space transformer of a beam probe apparatus. A beam probe apparatus is known to those skilled in the art.

Figure 1:
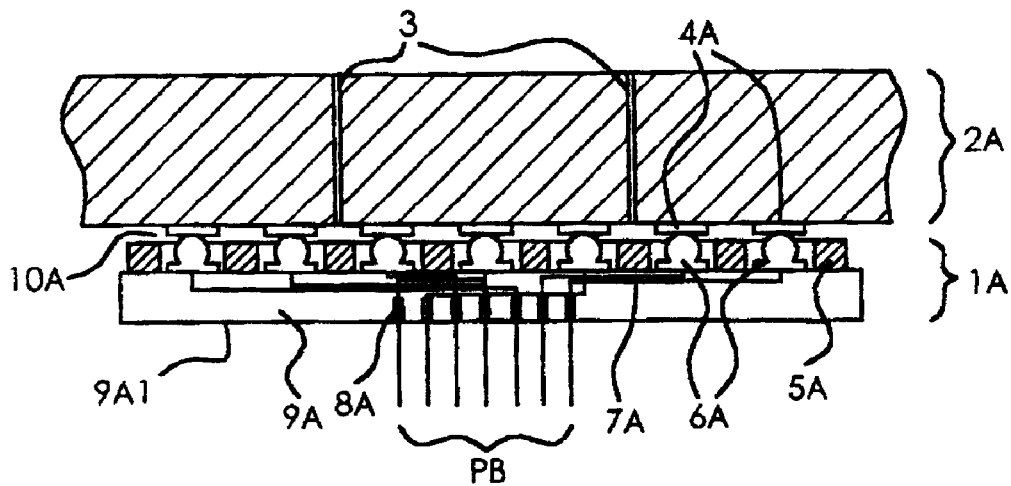
FIG. 1 shows a simplified section view of an embodiment of the invention where the primary structure is conductively connected to the secondary structure via a ball grid array.

In FIG. 1, the first primary structure 1A is shown with a first semiconductor body 9A being bonded to a first stiffening structure 5A. The first stiffening structure SA has recesses or openings that correspond to the dimensional configuration and positioning of a first ball grid array 6A and has a thickness that allows for contacting of the ball grid array 6A with a first set of contact p ads 4A of a secondary structure 2A. In addition, the first stiffening structure 5A leaves a resin gap 10A to a first secondary structure 2A. The resin gap 10A is accessible via filler channels 3.

The first semiconductor body 9A has a first reference face 9A1 and a number of finite via holes 8A passing through the first semiconductor body 9A. The finite via holes 8A are conductively connected via first conductive traces 7A to the individual solder balls of the ball grid array 6A.

In a fully assembled beam probe apparatus, probe beams PB (see FIGS. 1 and 2) with necks that are preferably spring loaded are retained in the finite via holes 8A such that they are conductively connected via the finite via holes 8A, the first conductive traces 7A, and the ball grid array 6A to the first contact pads 4A. The first contact pads 4A are conductively connected to external contacts as it is well known to those skilled in the art.

Figure 2:
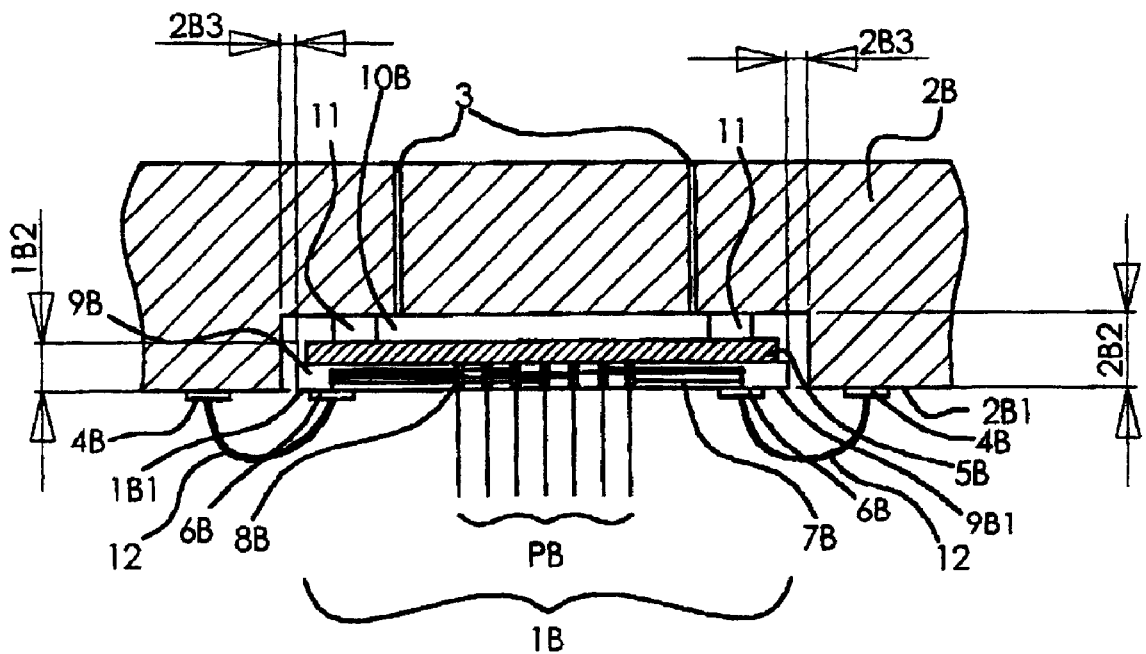
FIG. 2 shows a simplified section view of an embodiment of the invention where the primary structure is conductively connected to the secondary structure via wire bonded solder pads.

In FIG. 2, the second primary structure 1B is shown with a second semiconductor body 9B being bonded to a second stiffening structure 5B. The second stiffening structure 5B has together with the second semiconductor body 9B a primary structure thickness 1B2. The second secondary structure 2B has an assembly cavity 10B with a cavity depth 2B2. The assembly cavity 10B is accessible via the filler channels 3.

The second semiconductor body 9B has a second reference face 9B1, which is brought into essentially coplanar position with a secondary reference face 2B1 by spacers 11.

The second semiconductor body 9B has a number of via through holes 8B passing through the entire second semiconductor body 9B. The via through holes 8B are conductively connected via second conductive traces 7B to the individual primary solder pads of solder pad array 6B.

In a fully assembled beam probe apparatus, probe beams PB are assembled in the via through holes 8B such that they are conductively connected via the via through holes 8B, the second conductive traces 7B, the solder pad array 6B, and bonding wires 12 to second contact pads 4B. The second contact pads 4B are conductively connected to external contacts as it is well known to those skilled in the art.

First and second secondary structure 2A, 2B are preferably fabricated as printed circuit boards (PCBs). The first and second contact pads 4A, 4B are typically conductively connected with fanning-out conductive traces. The traces terminate in solder terminals or other external contacting features as is well-known to those skilled in the art.

It is noted that the first and second secondary structure 2A, 2B may be fabricated in any other way using other fabrication techniques. These will be determined according to the functional demands for a secondary structure of a space transformer as is known to those skilled in the art. In addition, the secondary structure itself may be attached and/or bonded to a further structure that additionally upscales the dimensional size of solder terminals and/or external contacting features. The secondary structure may thereby be conductively connected to the further structure in a manner analogues as it is de scribed in the above in reference to the first and second primary structure 9A, 9B.

First and second semiconductor bodies 9A, 9B are fabricated with techniques commonly known in the fabrication of semiconductors. It may be fabricated from one side and/or from two sides as it is known for flip chips. The aspects and specifics of fabricating the first and second semiconductor bodies 9A, 9B are further explained in reference to the FIGS. 3–6.

After the first and second semiconductor bodies 9A, 9B have been fabricated, they are bonded with first or second stiffening structure 5A, 5B respectively. The stiffening structures 5A, 5B are necessary to support and stiffen the first and second semiconductor bodies 9A, 9B during the assembly process. For economic reasons it is preferred to fabricate the first and second semiconductor bodies 9A, 9B from commercially available wafers, which are shipped in a range of thicknesses adjusted to the needs of the semiconductor manufacturing industry. In addition, for the two sided fabrication of the first and/or second semiconductor bodies 9A, 9B the wafer thickness cannot exceed the limitation defined by the ion implantation systems that are typically used to create conductive traces inside the semiconductor material as it is known to those skilled in the art.

During the fixating process of the first and second primary structure 1A, 1B resin is pumped into the resin gap 1A and the assembly cavity 10B and cured. The stiffening structure 5A, 5B is additionally configured to prevent and/or reduce elastic de formations of the first and second primary structures 1A, 1B imposed by volume changes of the resin during its curing process.

In the embodiment shown in FIG. 1, the first primary structure 9A is soldered and/or conductively fixated with its ball grid array 6A to the first contact pads 4A as it is known to those skilled in the art. The ball grid array 6A may be distributed all over the back surface of the first semiconductor body 9A or only over a sect ion of it. Dependent on the distribution of the ball grid array it provides a more or less stable mechanical connection between the first primary structure 1A and the first secondary structure 2A. The first stiffening structure 5A has a configuration with a relatively small thickness such that the deformation of the first semiconductor body 9A remains within a predetermined tolerance during the curing of the filler resin.

In the embodiment shown in FIG. 2, the second primary structure 9B is kept in position mainly by the spacers 11. Prior to the assembly and fixation of the second primary structure 1B within the second secondary structure 2B the fabricated depth 2B2 of the assembly cavity 10B and primary structure thickness 1B2 are measured. In a following step, the spacers 11 are adjusted to a thickness such that the second reference face 9B1 is coplanar with the secondary reference face 2B1. Since d the spacers 11 are preferably individually adjusted, only a relatively small number of them are used to define the position of the second primary structure 1B relative to the second secondary structure 2B. The second stiffening structure 5B has a configuration with a relatively large thickness such that the deformation of the second semiconductor body 9B remains within a predetermined tolerance during the curing of the filler resin.

The secondary reference face 2B1 and the second reference face 9B1 are positioned coplanar to each other such that the solder pad array 6B and the second contact pads 4B can by positioned in close proximity to the assembly gap 2B3. Consequently, the bonding wires 12 can be bonded straight between the solder pad array 6B and the second contact pads 4B and their inductance is thus kept to a minimum.

The fabrication of the first and second semiconductor bodies 9A, 9B with techniques used for the fabrication of circuit chips allows to fabricate the features necessary to hold and/or conductively contact the probe beams at the same scale as the tested circuit chips.

Figure 3:
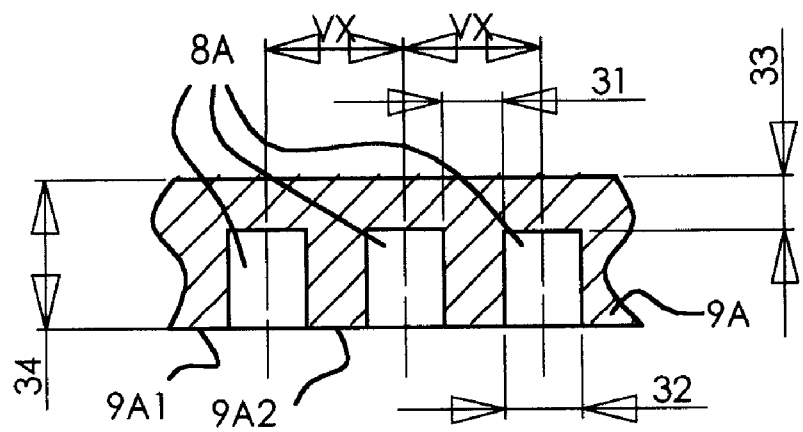
FIG. 3 shows an enlarged section of the primary structure with a number of vias fabricated along the probe beam direction.
Figure 4:
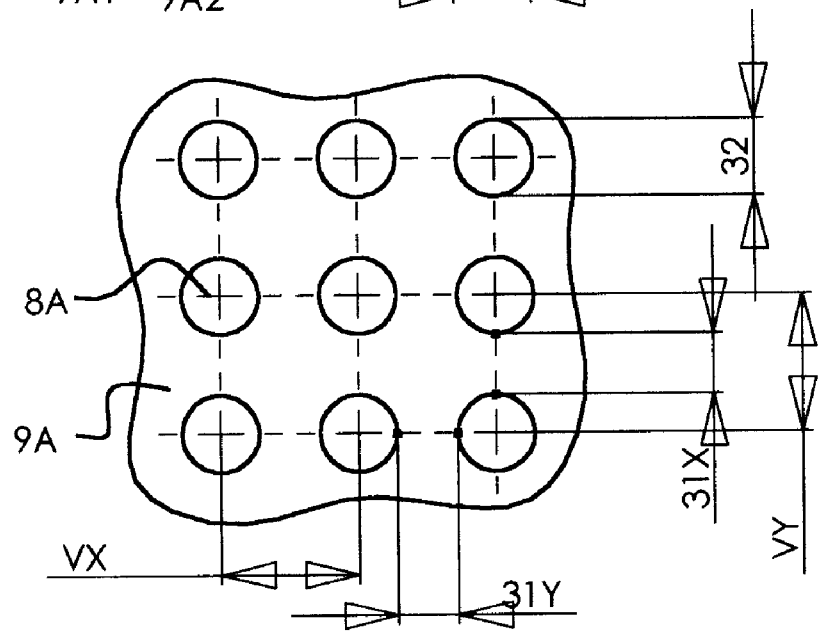
FIG. 4 shows a bottom view corresponding to the section view of FIG. 3 with the vias having a rotationally symmetric cross section.
Figure 5:
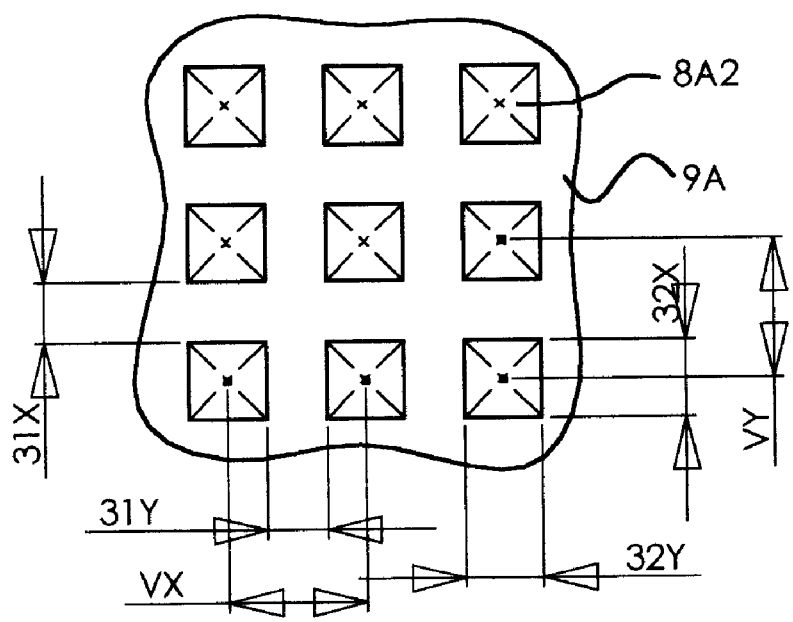
FIG. 5 shows a bottom view corresponding to the section view of FIG. 3 with the vias having a rectangular cross section.
Figure 6:
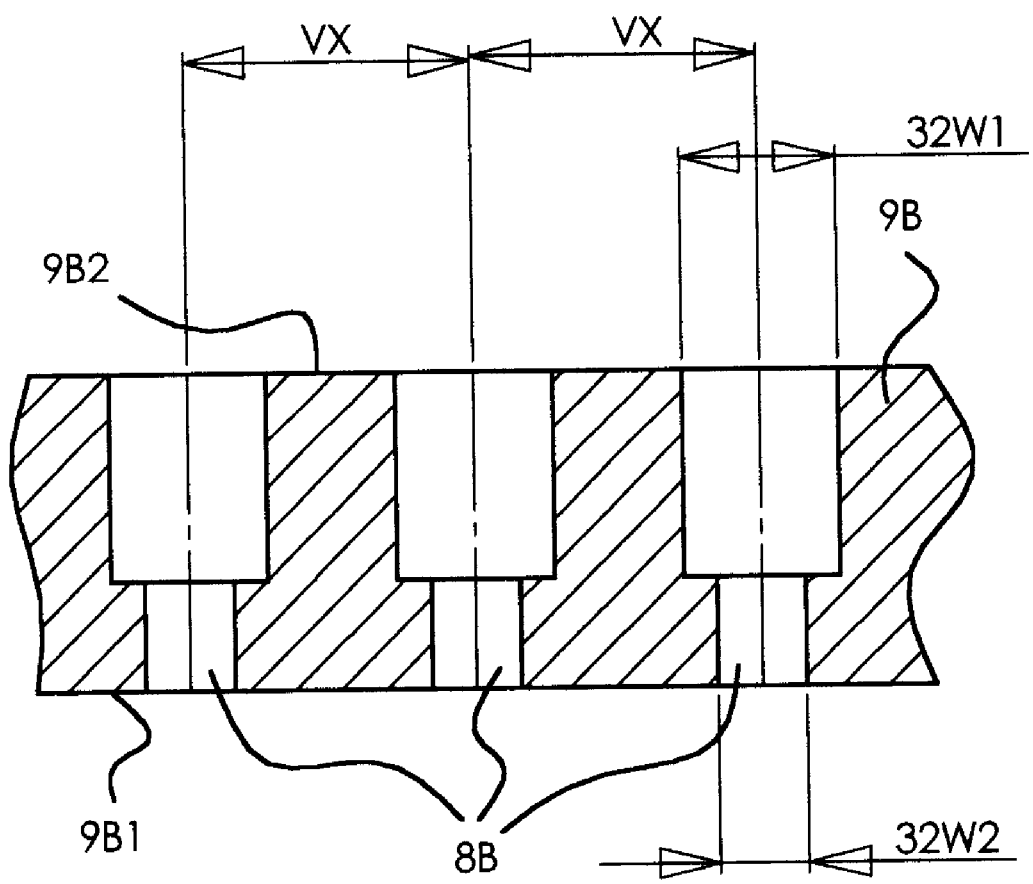
FIG. 6 shows an enlarged section of the primary structure with a number of vias fabricated along the direction of the stiffening structure.

FIGS. 3–5 show the key dimensions for the configuration of the finite via holes 8A in correspondence to a local body thickness 34.

In FIG. 3 an exemplary configuration of finite via holes 8A is shown in section view. The finite via holes 8A may have a diameter 32 for a round cross section (see FIG. 4) a first and second axial extensions 32X and 32Y for a square cross section (see FIG. 5). Between the finite via holes 8A defined with their section shape, their depth and their array spacing VX and VY (see FIGS. 4, 5) remains the solid structure defined by the remaining bottom thickness 33 and the remaining wall thickness 31.

The first conductive traces 7A that have to transmit the testing signals to and from the finite via holes 8A need a certain section size and have to be positioned within the first semiconductor body 9A of a predetermined insulating distance to each other. Since circuit chips are tested with higher voltages and currents than these at which they are operated, the traces of the first semiconductor body 9A typically have larger sections and are in bigger insulating distance to each other than in the tested circuit chip. Hence, the finite via holes 8A have to be shaped in correlation with a given local body thickness 34 and a given array spacing VX, VY such that sufficient remaining body structure is available for the maximum number of first traces 7A, which pass through the body. Also, the local body thickness 34 has to be selected in correlation to the given finite via holes 8A, the given array spacing VX, VY such that sufficient remaining body structure is available for the maximum number of first traces 7A, which pass through the body.

FIG. 5 shows an alternate embodiment with square and/or rectangular cross sections of the finite via holes BA of FIG. 3. Fabricating the finite via holes 8A from the fabrication top face 9A2 is preferably accomplished by applying a mask and etching as is known to those skilled in the art. Photoresistive masking techniques and other techniques, which typically offer a square pixel resolution can be used. By selecting the cross sections of the finite via holes 8A in correspondence to the square pixel resolution, the precision and smoothness of the finite via holes 8A can be maximized.

Rectangular cross sections also favorably effect the ratio between remaining body structure and a via volume for a given local body thickness 34, a given array spacing VX, VY, a given remaining wall thickness 31 and a given remaining bottom thickness 33. It is desirable to have the via volume to a maximum to hold the probe beams PB with a maximum cross section and a maximum length.

Vias are not limited to the finite via holes 8A. As described under FIG. 2, vias are fabricated in the form of the via through holes 8B that pass through the second semiconductor body 9B. The via through holes 8B allow one to use the second fabrication top surface 9B2 at the side of the second semiconductor body 9B, at which the second stiffening structure 5B is bonded. Fabricating the via through holes 8B from the second fabrication top surface 9B2 allows the creation of stepped via with a main vai section 32W1 (see FIG. 6) and narrowed via section 32W2 (see FIG. 6). Stepped vias allow for form based fixation of the probe beams rather than friction based fixation.

It is noted that in the case of the via through holes 8B the assembled probe beams become vertically referenced by contacting the second stiffening structure rather than the first semiconductor body 9A as it is the case of the finite vias holes 8A.

In correspondence to FIG. 1, the finite via holes 8A are fabricated while the fabrication top face 9A2 is coincident with the first reference face 9A1 as shown in FIG. 3. It is noted that the via through holes 8A and/or the finite via holes 8B may be employed in either the first or the. second primary structure 1A, 1B.

The remarks made in relation to FIGS. 3, 4 and 5, which are preferably related to the finite via holes 8A and the first semiconductor body 9A may as well be applied to the via through holes 8B and the second semiconductor body 9B. The description of FIGS. 3, 4 and 5 apply also for the embodiments in which the via through holes 8B are fabricated instead of the finite via holes 8A. For these embodiments the description of the remaining bottom thickness 33 is not applicable.

Accordingly, the scope of the invention presented in the description above is set forth by the following claims and their legal equivalents.

What is claimed is:

1. A space transformer for a probe beam array of a circuit chip probe apparatus, said space transformer comprising a primary structure and a secondary structure, said primary structure comprising:
   a) a semiconductor body structure comprising:
      I) a number of central contact means for contacting and holding probe beams of said probe beam array;
      II) a number of peripheral contact means for contacting contact means of said secondary structure; and
      III) a number of conductive traces having section shapes and deposited in an insulation distance to each other ,for conductively connecting said central contact means with said peripheral contact means; and
   b) a stiffening structure bonded to said semiconductor body structure;

wherein said primary structure is bonded to said secondary structure with a resin.

2. The space transformer of claim 1, wherein said a number of central contact means are vias.

3. The space transformer of claim 2, wherein said vias are fixating said probe beams in a closed force system.

4. The space transformer of claim 2, wherein said vias have a vias depth corresponding to a local height of said semiconductor body structure such that a first semiconductor section is available for containing said section shapes in said insulating distance.

5. The space transformer of claim 2, wherein said vias have a lateral clearance such that a second semiconductor section is available for containing said section shapes.

6. The space transformer of claim 2, wherein said vias pass through the semiconductor body structure such that said probe beams are in contact with said stiffening structure.

7. The space transformer of claim 1, wherein said a number of peripheral contact means are contacting balls contacting at least said contact means of said secondary structure.

8. The space transformer of claim 1, wherein said a number of peripheral contact means are solder pads wire bonded with said contact means of said secondary structure.

* * * * *